(12) United States Patent
Fong et al.

(10) Patent No.: US 6,937,025 B1
(45) Date of Patent: Aug. 30, 2005

(54) METHOD AND CIRCUIT EMPLOYING CURRENT SENSING TO READ A SENSOR

(75) Inventors: Edison Fong, Sunnyvale, CA (US); Robert S. Hannebauer, Sunnyvale, CA (US); Richard B. Merrill, Woodside, CA (US)

(73) Assignee: Foveon, Inc., Santa Clara, CA (US)

( * ) Notice: Subject to any disclaimer, the term of this patent is extended or adjusted under 35 U.S.C. 154(b) by 21 days.

(21) Appl. No.: 10/621,775

(22) Filed: Jul. 17, 2003

(51) Int. Cl.$^7$ .................... G01R 31/08; G01R 29/00
(52) U.S. Cl. ................ 324/522; 324/609; 324/76.79
(58) Field of Search ................ 324/609, 522, 324/76.79, 765, 111; 250/208.1, 208.2, 208.3, 250/208.4, 208.5; 365/185.21; 327/53

(56) References Cited

U.S. PATENT DOCUMENTS

| | | | |
|---|---|---|---|
| 3,781,574 A * | 12/1973 | White et al. ................. | 327/284 |
| 4,142,150 A * | 2/1979 | Morrow et al. ............. | 324/765 |
| 4,181,885 A * | 1/1980 | Gosser et al. ............... | 324/428 |
| 4,463,383 A | 7/1984 | Soneda et al. .............. | 358/212 |
| 4,788,494 A * | 11/1988 | Faulkner ..................... | 324/142 |
| 4,816,768 A * | 3/1989 | Champlin .................... | 324/428 |
| 5,059,916 A * | 10/1991 | Johnson ....................... | 324/713 |
| 5,801,533 A * | 9/1998 | Kalb, Jr. ..................... | 324/252 |
| 5,898,168 A * | 4/1999 | Gowda et al. ........... | 250/208.1 |
| 5,929,434 A * | 7/1999 | Kozlowski et al. ..... | 250/214 A |
| 6,344,651 B1 * | 2/2002 | Woolaway et al. .... | 250/370.08 |
| 6,417,504 B1 * | 7/2002 | Kozlowski .............. | 250/214 R |
| 6,480,227 B1 * | 11/2002 | Yoneyama .................. | 348/308 |
| 6,791,613 B2 * | 9/2004 | Shinohara et al. .......... | 348/308 |

OTHER PUBLICATIONS

Fong, Edison, et al., "A High Performance 256K (512K) Static ROM," *IEEE Journal of Solid-State Circuits*, vol. SC-18, No. 6, Dec. 1983, pp. 807-810.

Wong, Joseph, et al., "A 45 ns Fully Static 16K MOS ROM," *IEEE Journal of Solid-State Circuits*, vol. SC-16, No. 5, pp. 592-594 (Oct. 1981).

Yang, David X.D., et al., "A Nyquist Rate Pixel Level ADC for CMOS Image Sensors," pp. 1-4, downloaded from the Internet from http://www-isl.stanford.edu/~abbas/group/papers_and_pub/cicc.98.pdf (Jun. 21, 2001).

* cited by examiner

*Primary Examiner*—Anjan Deb
(74) *Attorney, Agent, or Firm*—Girard & Equitz LLP

(57) ABSTRACT

A current sensing method and circuit for reading out a sensor cell, and a sensing apparatus comprising an array of sensor cells arranged along column lines and a current sensing readout circuit coupled to each column line. The sensor cell is configured to assert a sensor current indicative of a sensed value. In operation, an input node of the readout circuit is coupled to the sensor cell, typically by a column line of a sensor array that includes the sensor cell. Preferably, to read out the sensor cell, the sensor current flows from the sensor cell to the input node and in response, the readout circuit charges a capacitor to a voltage indicative of the sensed value while clamping the input node at a potential that is at least substantially fixed.

15 Claims, 5 Drawing Sheets

METHOD AND CIRCUIT EMPLOYING CURRENT SENSING TO READ A SENSOR

BACKGROUND OF THE INVENTION

1. Field of the Invention

The present invention relates to methods and circuitry for reading sensors, such as columns of photodiode sensors (which can be sensors of vertically stacked photosensitive sensor groups) or other sensors. In preferred embodiments, the invention is a circuit that employs current sensing to read each photodiode sensor connected along a column line of an array of photosensitive sensor groups.

2. Background of the Invention

The expression that an item "comprises" an element is used herein (including in the claims) to denote that the item is or includes the element.

The term "capacitor" is used herein to denote an element or combination of elements having capacitance.

The term "radiation" is used herein to denote electromagnetic radiation. The expression "top sensor" (of a sensor group) herein denotes the sensor of the group that radiation, incident at the sensor group, reaches before reaching any other sensor of the group. The expression that the sensors of a sensor group are "vertically stacked" denotes that one of the sensors is a top sensor of the group, and that the group has at least one axis (sometimes referred to as a "vertical axis") that extends through all the sensors.

MOS active pixel sensors are known in the art. Active pixel sensor arrays that are selective according to wavelength ("multiple-wavelength band active pixel sensor arrays") are also known in the art. One type of multiple-wavelength band active pixel sensor array employs red, green, and blue sensors disposed horizontally in a pattern at or near the semiconductor surface. Color overlay filters are employed to produce this color selectivity between the red, green, and blue sensors.

Another type of multiple-wavelength band pixel sensor array employs groups of sensors, each group including sensors in a vertically-oriented arrangement. For example, U.S. Pat. No. 5,965,875 to Merrill, discloses a three-color, visible light, sensor group in which a structure is provided using a triple-well CMOS process wherein the blue, green, and red sensitive PN junctions are disposed at different depths relative to the surface of the semiconductor substrate upon which the imager is fabricated. This three-color sensor group permits fabrication of a dense imaging array because the three colors are sensed over approximately the same area in the image plane.

Several types of vertical color filter ("VCF") sensor groups and methods for fabricating them are described in U.S. patent application Ser. No. 09/884,863, filed on Jun. 18, 2001, and in U.S. patent application Ser. No. 10/103,304, filed on Mar. 20, 2002. A VCF sensor group includes at least two photosensitive sensors that are vertically stacked with respect to each other (with or without non-sensor material between adjacent sensors). Each sensor of a VCF sensor group has a different spectral response. Typically, each sensor has a spectral response over a differing range of photon wavelengths. A VCF sensor group simultaneously can sense photons in singular or multiple wavelength bands in the same area of the imaging plane depending upon construction. In contrast, time sequential photon sensing methods (such as filter wheel still photography techniques) do not perform photon sensing at the same time for all wavelength bands. The sensing performed by a VCF sensor group included in an imager occurs in one area of the imaging plane, and photons are separated by wavelength as a function of depth into the sensor group.

Typically, each sensor detects photons in a different wavelength band (e.g., one sensor detects more photons in the "blue" wavelength band than each other sensor, a second sensor detects more photons in the "green" wavelength band than each other sensor, and a third sensor detects more photons in the "red" wavelength band than each other sensor), although the sensor group typically has some "cross-talk" in the sense that multiple sensors may detect photons of the same wavelength.

Each sensor of a VCF sensor group typically includes two or three layers of semiconductor material, there is a junction (e.g., a "p-n" junction) between two adjacent layers for a given wavelength detecting sensor, and at least one of the sensor's layers is a carrier-collection element having a contact portion that enables the determination of the collected photo generated charge (accessible to biasing and readout circuitry). The other contact is commonly through the substrate to complete the electrical circuit and function of photon detection. For example, a VCF sensor group can include blue, green, and red photodiode sensors formed by the junctions between vertically stacked n-type and p-type regions (disposed at different depths beneath the surface of a semiconductor structure). During typical operation, a biasing and readout circuit is coupled to a contact portion of each sensor, and the layers of each sensor are biased so that photogenerated carriers migrate through at least one depletion region to the contact portion to make a photocharge signal available at the contact portion.

VCF sensor groups can be used for a variety of imaging applications. In preferred embodiments, they are used in digital still cameras (DSC). However they can be employed in many other applications and implementations, such as linear imagers, video cameras and machine vision equipment.

A VCF sensor group uses the properties of at least one type of semiconductor material to detect incident photons, and also to selectively detect incident photons of different wavelengths at different depths in the material. The detection of different wavelengths is possible due to the vertical stacking of the sensor layers of the sensor group in combination with the variation of optical absorption depth with wavelength in indirect band-gap semiconductor materials.

A VCF sensor group is preferably formed on a substrate (preferably a semiconductor substrate) and comprises a plurality of vertically stacked sensors (e.g., sensor layers) configured by doping and/or biasing to collect photo-generated carriers of a first polarity (preferably negative electrons). The sensors include (or pairs of the sensors are separated by) one or more reference layers configured to collect and conduct away photo-generated carriers of the opposite polarity (preferably positive holes). The sensors have different spectral sensitivities based primarily on their different depths in the sensor group. In operation, the sensors are individually connected to biasing and active pixel sensor readout circuitry. VCF sensor groups and methods for fabricating them are discussed more fully in U.S. patent application Ser. No. 09/884,863, and U.S. patent application Ser. No. 10/103,304.

FIG. 1 is a simplified schematic diagram of elements of a sensor cell (including photodiode 2, switch 1, and NMOS transistors m1 and m2) connected along a column line (line 3), and conventional readout circuitry (NMOS transistors m15 and m16 and capacitor C, connected as shown at the bottom of line 3) for readout of photodiode 2. Typically, switch 1 is an NMOS transistor. Alternatively, switch 1 can be implemented in another manner.

Optionally, the sensor cell includes a VCF sensor group (including photodiode sensor 2 and at least one other photodiode sensor), circuitry for biasing each sensor of the VCF sensor group, and a source follower coupled to each sensor of the VCF sensor group. In one implementation, for example, photodiode 2 is a "blue" sensor of the VCF sensor group, a second photodiode of the group (vertically stacked with photodiode 2) is a "green" sensor, and a third photodiode of the group (vertically stacked with photodiode 2) is a "red" sensor, and each sensor of the cell is coupled to a separate column line so that the "green" sensor is read out via a second column line (not shown in FIG. 1, and distinct from column line 3 of FIG. 1) and the "red" sensor is read out via a third column line (not shown in FIG. 1, and distinct from column line 3 of FIG. 1).

The sensor cell including photodiode 2 is typically an element of an image sensor array that includes rows and columns of sensor cells, and each sensor cell includes a sensor or sensor group. Two or more sensor cells (typically, many sensor cells) are connected along each column line of the array, and a readout circuit (identical to the readout circuit of FIG. 1) is coupled (by transistor m15 or a counterpart thereto) to the bottom of each column line. A video bus (video bus 5 of FIG. 1) is connected to all the readout circuits.

With reference to FIG. 1, row select transistor m2 can be turned on to select photodiode 2's row, by coupling the cell containing photodiode 2 to column line 3. Column select transistor m15 can be turned on to select photodiode 2's column, by coupling the readout circuitry to column line 3. The output of the readout circuitry is asserted to video bus 5 by pulsing on readout select transistor m16 at appropriate times. Typically, multiple columns of the image sensor array (including the sensor cell containing photodiode 2) are selected simultaneously and the sensor cells connected along different rows of each selected column are read out sequentially. Each photodiode sensor of each cell is read out by generating an output value (i.e., a voltage at Node B) indicative of the radiation incident on the sensor during an exposure time and asserting the output value to video bus 5.

During operation of the FIG. 1 circuit, switch 1 is closed to reset photodiode 2 to some predetermined voltage (VREF, which is typically in the range from 1 volt to 3 volts). Switch 1 is then opened and photodiode 2 is exposed to light, by opening a shutter (not shown). Photocurrent occurring while photodiode 2 is being exposed to light decreases the potential at the gate of NMOS transistor m1 Transistor m1 serves as a source follower, so that (when transistors m2 and m15 are on) a current I1 indicative of the potential at transistor m1's gate flows through transistors m1 and m2, and transistor m15 to capacitor C.

Before transistors m2 and m15 are switched on to read out photodiode 2, capacitor C (whose capacitance is typically 5 pF) is discharged (using circuitry not shown in FIG. 1). When capacitor C has been discharged, photodiode 2 has been exposed to radiation, and transistors m2 and m15 are then switched on, capacitor C begins to charge up in response to current I1 from transistor m1. Capacitor C charges up until the potential at Node B (coupled to one plate of capacitor C) rises to (and settles at) $V_{out}=V_A-V_{th}$, where $V_A$ is the potential at Node A (the cathode of photodiode 2) and $V_{th}$ is the threshold voltage between the gate and source of transistor m1.

When capacitor C has been fully charged, output signal $V_{out}$ (the voltage at Node B) is asserted to video bus 5 by switching on read select transistor m16 (by asserting the signal "rd sel" with a high level to the gate of transistor m16). The drain and source of transistor m16 are connected, respectively, to Node B and video bus 5.

Unfortunately, the process of charging capacitor C of FIG. 1 is slow. In typical implementations, about 50 μsec is required to do so. One reason that the process of charging capacitor C of FIG. 1 is slow is that, as capacitor C is charged, the potential at the source of transistor m1 rises and thus the voltage between the gate and source of transistor m1 decreases (so that the charging current I1 also decreases). Transistor m1 of FIG. 1 is virtually "off" at the end of the charging time. If in a typical image sensor array, there are 2304 columns and 1536 rows of sensor cells, with each sensor cell comprising a VCF sensor group that includes three photodiode sensors, and each photodiode sensor of each group connected via a source follower transistor to a separate column line, at 50 μsec per row and a pixel rate of 20 MHz, it would take 254 milliseconds to read out the whole imager. When the row charging time is reduced by a factor of 10x, the photo capture time is reduced significantly to 184 milliseconds.

A long time is required for charging capacitor C of FIG. 1 because the rising potential at the source of transistor m1 (while capacitor C is charging) causes transistor m1 to turn off while capacitor C is charging. This is a consequence of the voltage sensing approach implemented by the FIG. 1 circuit, in which the voltage between the gate and source of transistor m1 directly determines the amount of current (flowing through transistor m1) that is available for charging the capacitor. Unfortunately, the source voltage is moving towards the gate voltage during this charge up cycle and ends up turning transistor m1 off. As the transistor turns off it transitions from full active into the triode region of operation and then into the sub-threshold region of operation. Operation in both of the latter regions exhibits decreased operational speed. Additionally, the stray capacitance of the column contributes to the charged capacitance and further slows down the process although no use can be made of charging up this additional capacitance.

Rather than using the conventional approach (described with reference to FIG. 1) of voltage sensing using a source follower (transistor m1) to read the sensor cells of a sensor array, preferred embodiments of the invention employ a current sensing approach to read each sensor cell of a sensor array (e.g., a photodiode image sensor array). Circuit simulations have shown that by employing a preferred embodiment of the inventive readout circuit to replace the conventional readout circuit shown in FIG. 1 at the bottom of each column line of a photodiode image sensor array, the time required to charge a readout capacitor (e.g., capacitor C) of each readout circuit can be reduced by a factor of about 50x.

Also, the inventive current sensing technique allows "binning" of the outputs of individual sensor cells of an image sensor array to be performed accurately and with simple circuitry. "Binning" is the combining of multiple pixels (e.g., 2×2 or 4×4 subsets of pixels) of a sensed image, for example to produce lower resolution pictures with higher light sensitivity. A typical application of binning is to produce a reduced-resolution video image or viewfinder image from an imager that can produce a high resolution still image. Binning can also be performed to obtain a super-high-speed, low-resolution mode from an imager that normally produces a standard or high-speed video output. Typically, a binning operation adds or averages the signals from sensors in multiple rows and columns of a sensor array, to produce a combined sensor output from each of many subsets of sensors of the array. In a conventional imager comprising an array of sensors of the type shown in FIG. 1 and conventional readout circuitry (of the type shown in FIG. 1) connected at the bottom of each column line, the outputs of multiple sensors connected along the same column (each sensor connected along a different row) cannot be accurately combined in a simple manner. For example, in such a conventional imager, the outputs of multiple sensors connected along the same column cannot be accurately combined simply by charging the column's storage capacitor (capacitor C of FIG. 1) in response to the source follower transistors (e.g., transistor m1 of FIG. 1) of two or more rows at the same time, and then decoupling the capacitor from the source follower transistor of each row, and finally connecting the capacitor to the video bus (by switching on transistor m16 of FIG. 1) to assert a combined output signal from the capacitor to the video bus.

BRIEF DESCRIPTION OF THE INVENTION

In a class of embodiments the invention is a sensor cell and a current sensing readout circuit coupled to the sensor cell. The sensor cell is configured to assert to the readout circuit a sensor current indicative of a sensed value. In some embodiments, the sensor cell comprises a sensor configured to assert the sensor current. Alternatively, the sensor cell comprises a sensor (e.g., a photodiode) configured to assert a raw output that is not a current (but is indicative of the sensed value), and circuitry (e.g., a source follower) configured to assert the sensor current in response to the raw output. An input node of the readout circuit is coupled to the sensor cell, typically by a column line of a sensor cell array that includes the sensor cell. To read out the sensor cell, the sensor current flows from the sensor cell to the readout circuit's input node and in response, the readout circuit charges a capacitor to a voltage indicative of the sensed value while clamping the input node at a fixed (or substantially fixed) potential. Preferably, the voltage can be sampled (e.g., to a video bus) by asserting a control signal to the readout circuit.

In preferred embodiments, the sensor cell read by the inventive readout circuit comprises an image sensor. For example, the image sensor can comprise a photodiode (of a VCF sensor group that includes two or more vertically stacked photodiodes) and a source follower coupled to the photodiode. In other embodiments, the sensor cell comprises a sensor that is not an image sensor. The invention is particularly useful to obtain readout of sensors in applications in which fast readout is critical. In a class of embodiments, the readout circuit of the invention has a current sensing input node, an output node, and output voltage generation circuitry between the current sensing input node and the output node. In typical embodiments in this class, a readout capacitor is coupled to the output node and the readout circuit's input node is coupled by a column line to a sensor cell. In current mode operation of such typical embodiments, a sensor current (indicative of a sensed value) is asserted from the sensor cell to the input node and the readout circuit operates in response to the sensor current to charge the readout capacitor to a voltage indicative of the sensed value while clamping the input node at a potential that is at least substantially fixed. Preferably, the output voltage generation circuitry includes at least one circuit element (e.g., a load transistor) and a differential pair coupled and configured to provide feedback to the at least one circuit element to reduce the voltage excursion at the input node during current mode operation. Alternatively, the output voltage generation circuitry includes an op amp, and circuitry configured to provide feedback from op amp's output to the input node.

In another class of embodiments, the readout circuit of the invention includes a Wilson current mirror whose current sensing input is the readout circuit's input node, and additional circuitry (including a storage capacitor) coupled to the Wilson current mirror. The readout circuit is configured to produce a mirrored current at a capacitor-charging node of the additional circuitry by mirroring the sensor cell's output current (received from the sensor cell at the readout circuit's input node). Optionally, the readout circuit applies a non-unity gain to the input current, so that the mirrored current is not identical to the input current. In preferred embodiments, the gain is greater than one. In typical embodiments of this class, the readout circuit converts the mirrored current at the capacitor-charging node to a voltage and provides charging current determined by this voltage from the capacitor-charging node to the storage capacitor. In other embodiments, the readout circuit does not convert the mirrored current at the capacitor-charging node to a voltage, but does provide charging current to the storage capacitor.

Another aspect of the invention is a sensing apparatus comprising an array of sensor cells (e.g., an array of VCF sensor groups, each sensor group including two or more photodiode sensors) arranged in rows along column lines, and a readout circuit coupled to each column line. In the case that the sensor cells are image sensor cells, the sensing apparatus is an image detector (to be referred to sometimes as an "imager"). Any embodiment of the inventive readout circuit can be coupled to each column line to read out the sensor cells connected along the column line. In some embodiments, at least one sensor cell comprises at least one sensor configured to assert a sensor current (indicative of a sensed value) on one of the column lines.

Another aspect of the invention is a current sensing method for reading out a sensor cell. In a class of embodiments, the method includes the steps of asserting a sensor current (indicative of a sensed value) from the sensor cell to an input node of a readout circuit, and operating the readout circuit in response to the sensor current to charge a capacitor to a voltage indicative of the sensed value while clamping the input node at a potential that is at least substantially fixed.

BRIEF DESCRIPTION OF THE DRAWING FIGURES

Figure 4:
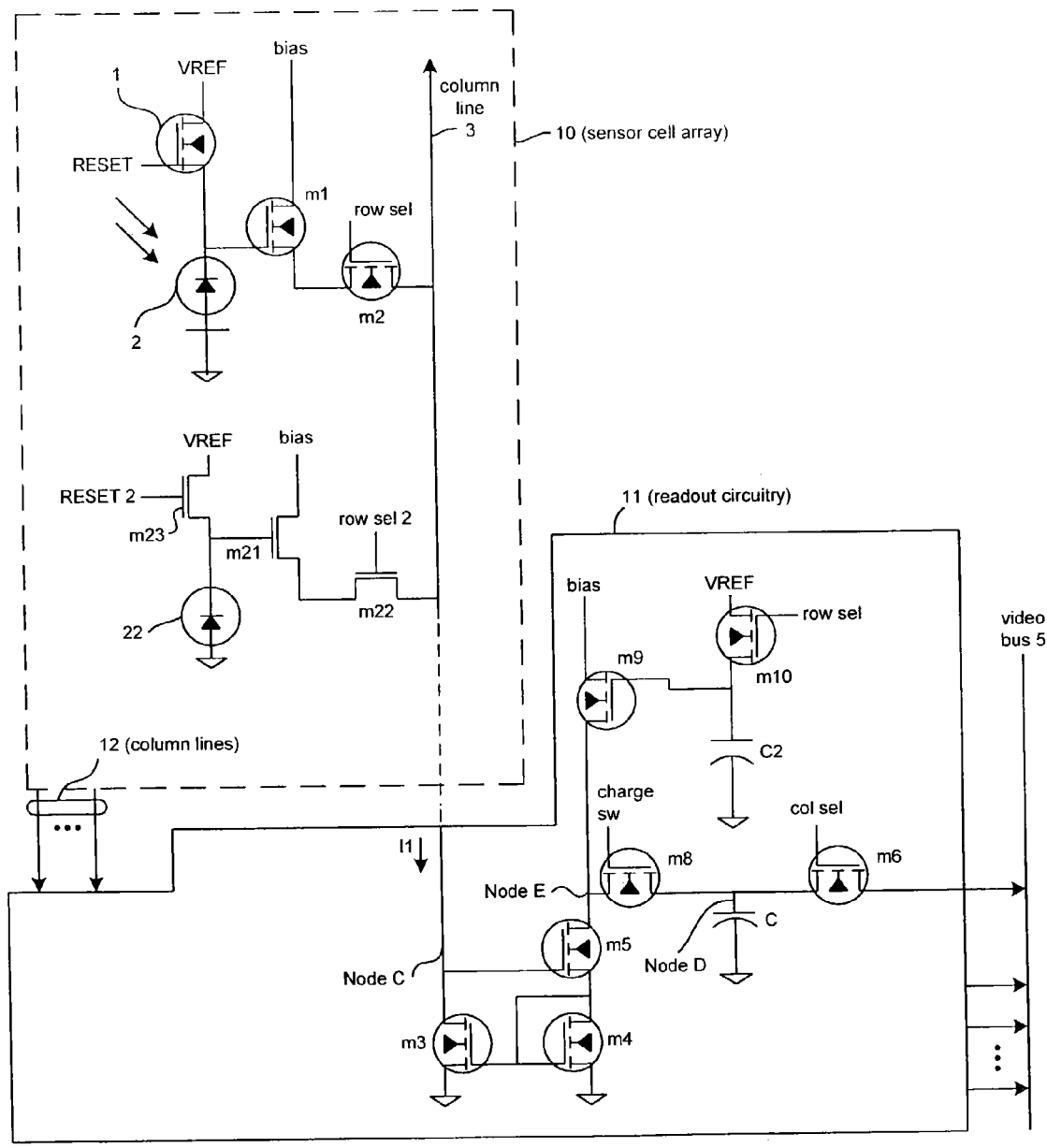

FIG. 4 is a block diagram of an embodiment of the inventive image detector that includes sensor cell array 10 and readout circuitry 11. Within block 10 are simplified schematic diagrams of two sensor cells (one including photodiode 2; the other including photodiode 22) of the set of sensor cells that can be connected along column line 3. Within block 11 is a simplified schematic diagram of an embodiment of the inventive readout circuitry for reading out each sensor cell connected along column line 3.

Figure 5:
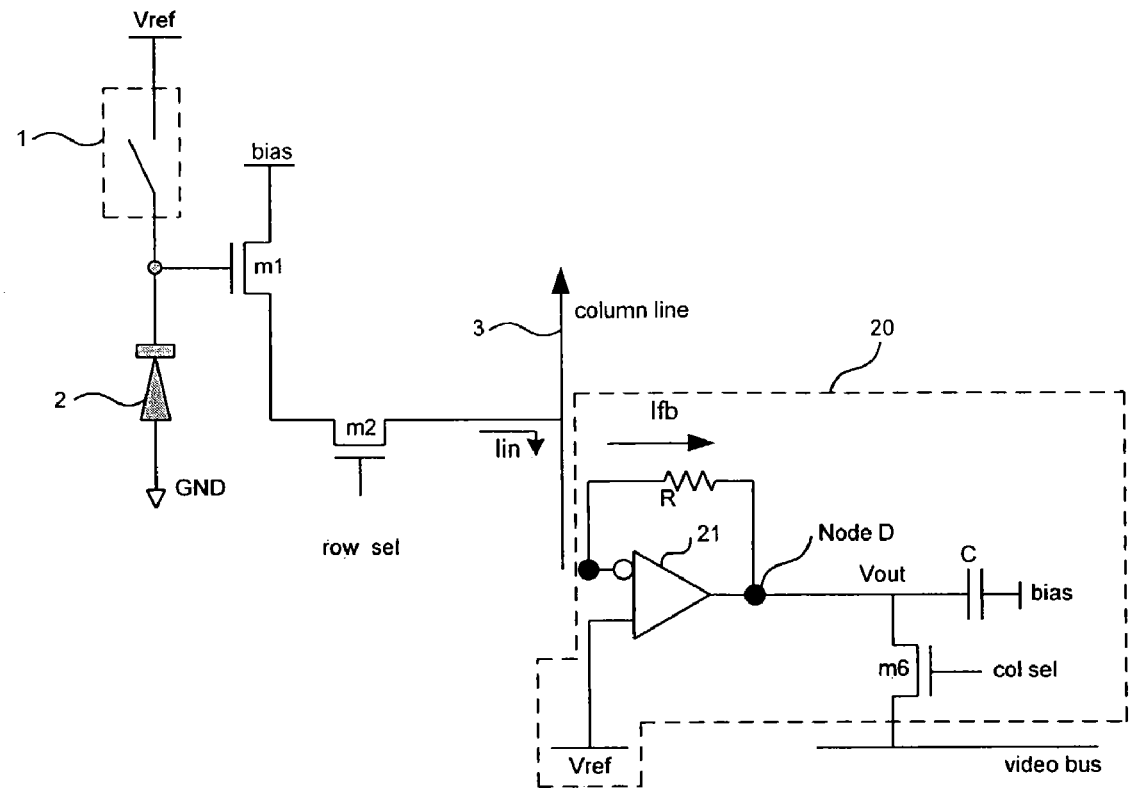

FIG. 5 is a simplified schematic diagram of a sensor cell and another embodiment of the inventive sensor readout circuitry coupled to the cell.

Figure 6:
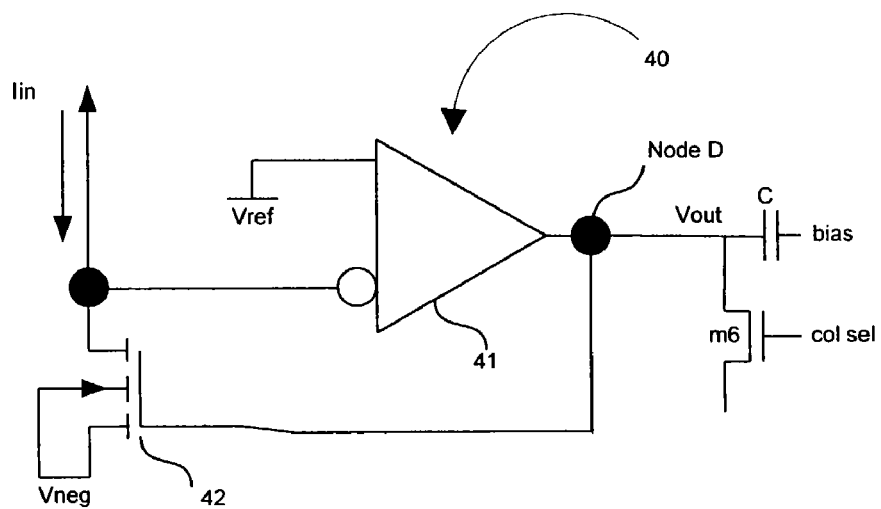

FIG. 6 is a simplified schematic diagram of another embodiment of the inventive sensor readout circuitry which can be coupled between a sensor cell (or a column line along which many sensor cells are connected) and a video bus.

Figure 7:
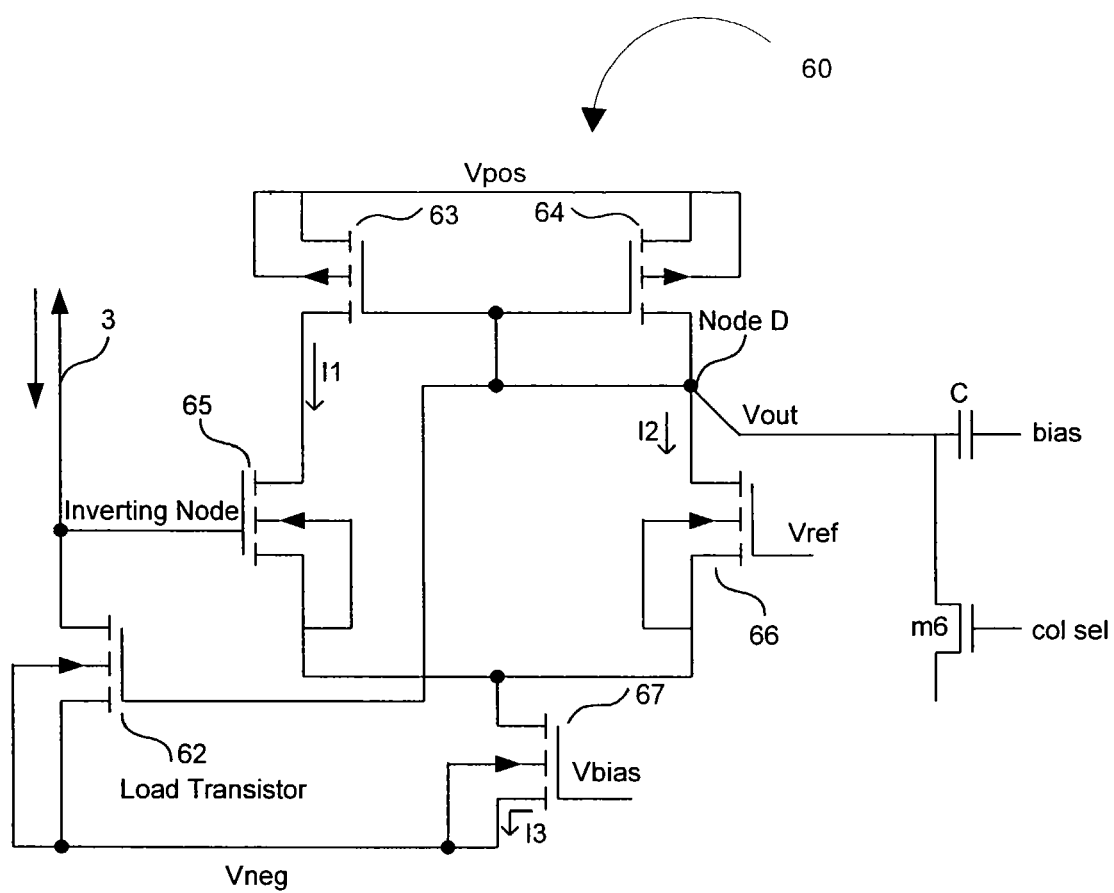

FIG. 7 is a simplified schematic diagram of another embodiment of the inventive sensor readout circuitry which can be coupled between a sensor cell (or a column line along which many sensor cells are connected) and a video bus.

DETAILED DESCRIPTION OF THE PREFERRED EMBODIMENTS

Persons of ordinary skill in the art will realize that the following description of the present invention is illustrative only and not in any way limiting. Other embodiments of the invention will readily suggest themselves to such skilled persons having the benefit of this disclosure.

The inventive technique for readout of sensor cells (e.g., columns of sensor cells of an image sensor array) can be used to reduce the lengthy time that had been required for conventional readout of CMOS active pixel sensors connected along columns of CMOS active pixel sensor arrays.

In a class of embodiments, the inventive circuitry is employed to read each sensor of each VCF sensor group of an array of VCF sensor groups. Each such sensor is typically a CMOS active pixel sensor.

Figure 1:
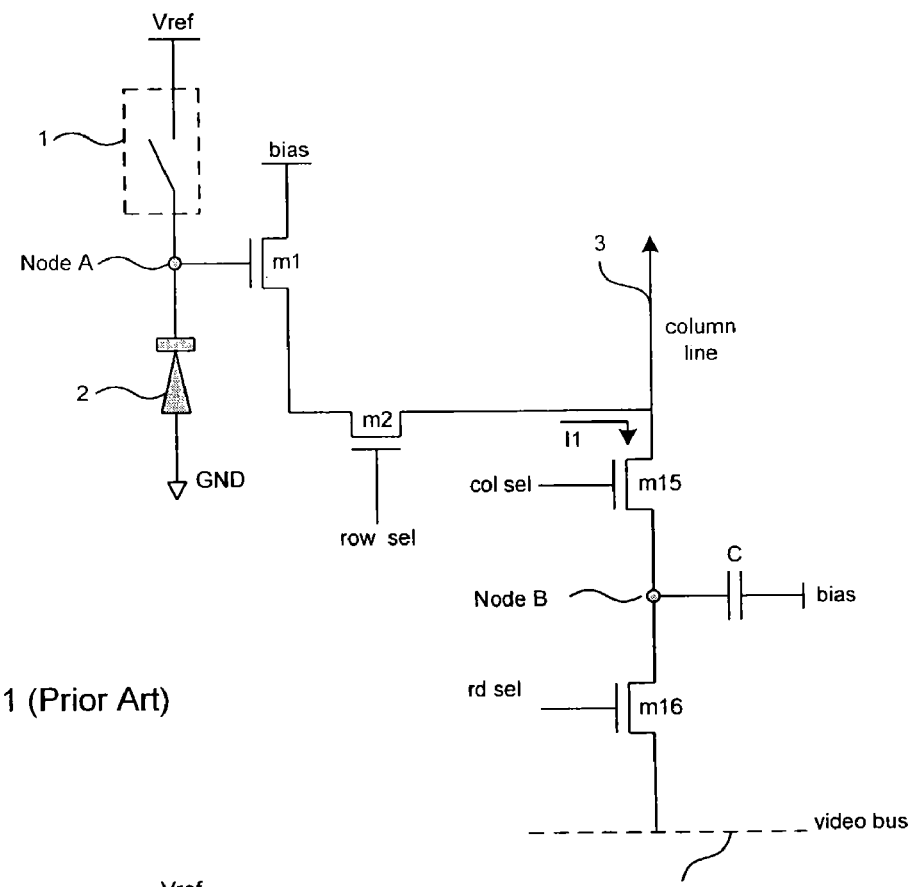
FIG. 1 is a simplified schematic diagram of a sensor cell (including photodiode 2) and conventional sensor readout circuitry coupled to the cell.
Figure 2:
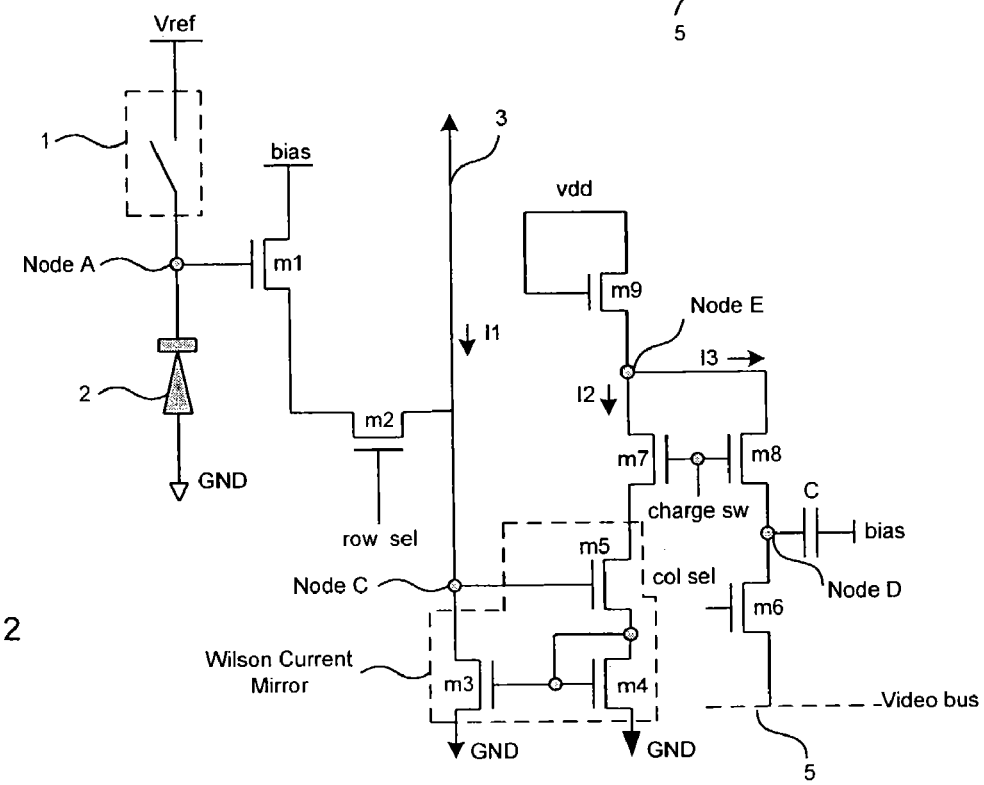
FIG. 2 is a simplified schematic diagram of a sensor cell (including photodiode 2), and an embodiment of the inventive sensor readout circuitry coupled to the cell.

FIG. 2 is a simplified schematic diagram of a sensor cell (comprising photodiode 2, switch 1, and transistors m1 and m2) and an embodiment of the inventive readout circuitry which is configured to employ a current sensing approach to read out photodiode 2 of the sensor cell. The sensor cell of FIG. 2 is identical to the sensor cell of FIG. 1 (also comprising a photodiode 2, switch 1, and transistors m1 and m2). The sensor cell of FIG. 2 is typically an element of an image sensor array having column lines, a copy of the readout circuitry shown in FIG. 2 is coupled to each column line of the sensor array, and the layout and cell characteristics of the sensor array can be the same as those of an image sensor array that includes the sensor cell of FIG. 1. The elements of FIG. 2 that are identical to corresponding elements of FIG. 1 are numbered identically in FIGS. 1 and 2 and the description thereof will not be repeated. The readout circuitry of FIG. 2 comprises NMOS transistors m3, m4, m5, m6, m7, m8, and m9 and capacitor C, connected as shown at one end (to be referred to as the "bottom") of column line 3. The method by which the readout circuitry of FIG. 2 detects the photogenerated charge in photodiode 2 differs from the method by which the readout circuitry of FIG. 1 does so. We next explain the differences between these two methods.

In the readout circuitry of FIG. 1, capacitor C (whose capacitance is typically 5 pF) is charged by source follower transistor m1. All the charge on capacitor C comes from transistor m1 via transistors m2 and m15. Transistor m1 is typically a small, inefficient transistor (e.g., having a channel width to channel length ratio of $1.4\mu/0.5\mu$) having severely limited charging ability.

In contrast, in the FIG. 2 circuit, transistor m1 stays on during charging of capacitor C because of the active load presented by NMOS transistors m3, m4, and m5 of the readout circuitry. Transistors m3, m4, and m5 are connected as shown (with the gates of m3 and m4 coupled to the source of m5, and the drain of m3 coupled to the gate of m5 and the source of m2) in a configuration sometimes referred to as a Wilson current mirror. The FIG. 2 circuit has a current sense node (identified as "Node C" in FIG. 2) between the source of transistor m2 and the drain of transistor m3, which is clamped at a fixed potential during charging of capacitor C. The Wilson current mirror provides a relatively high output impedance for the sensor cell of FIG. 2 (i.e., a high output impedance at the drain of transistor m3 looking into the source of transistor m1). This output impedance is slightly lower than that of the transconductance of transistor m3, because transistor m3 is in a feedback loop with transistors m4 and m5. This keeps the voltage at the current sense node (Node C) constant.

An important advantage of the FIG. 2 circuit is that transistors m3, m4, and m5, connected as shown, serve as a current mirror with transistor m3 functioning as a reference device and transistor m4 as a current multiplier device. More importantly, the drive voltage of m3 is held at least substantially constant throughout the entire sensing process because transistors m3, m4 and m5 are in a closed loop configuration. The drain of m3 is clamped at a potential slightly greater than 2(Vt) above ground, where Vt is the threshold voltage of each of transistors m3, m4 and m5. This condition forces the source of m1 to be at a potential approximately 2(Vt) above ground, and to remain at such potential without varying significantly throughout the sensing process. The design of FIG. 2 has significant consequences that result in much faster response time: transistor m1 is always in the forward active region while capacitor C is charging, with a current through its channel that remains at least substantially constant current (and does not taper off with time); and transistor m1 does not need to charge the capacitance of column line 3. Because the voltage at node C and hence the column itself does not move, none of the current is used to charge the column capacitance (the actual storage capacitance and parasitic capacitance—the stray capacitance can be on the order of 3 pF for larger arrays). The small transistor m1 sees a greatly reduced capacitance (small signal capacitance is greatly reduced) and hence the bandwidth (which is proportional to the transconductance of m1 divided by the load capacitance) is greatly increased. Another important effect is that the transistor m1 no longer has to supply the current to charge the downstream capacitors. The circuitry which does this does not have nearly the same limitation on the amount of metal/wiring that can be used to implement it while still ensuring proper operation. Too much metal in an image sensor array will block light, and thus metal should be used judiciously in elements (e.g., transistor m1) in sensor cells, whereas more metal can be used away from the sensor cells (e.g., in readout circuitry).

The other elements of the readout circuitry of FIG. 2 are NMOS transistor m9 (whose gate and drain are maintained at potential Vdd), column select NMOS transistor m6 (whose gate is controlled by the column select signal "col sel"), NMOS transistor m7 (whose drain is coupled to the source of m9, whose source is coupled to the drain of m5, and whose gate is controlled by control signal "charge sw"), capacitor C, and NMOS transistor m8 (whose drain is coupled to the source of m9, whose source is coupled to the drain of m6 and a plate of capacitor C at Node D, and whose gate is controlled by control signal "charge sw"). The source of transistor m6 is coupled to video bus 5.

The current generated by transistor m1 is multiplied by transistor m4. The current multiplication factor (the ratio of current I1 through the channel of m1 to the current I2 through the channel of m4) is determined by the characteristics of transistor m4 relative to those of transistor m3, and this multiplication factor can vary from 1 to 10 and without significant consequences. The current I2 through the channel of transistor m4 is converted back to a voltage (the difference between Node E's potential and ground potential) by transistor m9. The potential at Node E is indicative of the sensor output (the potential at Node A, which is the potential of the gate of transistor m1).

The characteristics of transistors m9 and m1 are preferably matched in the FIG. 2 embodiment (and in the FIG. 4 embodiment to be described below). In the FIG. 2 embodiment, gm variation (of transistor m1 relative to transistor m9) results only in secondary effects. This phenomenon occurs because as the transconductance gm of m1 increases, the drain potential of transistor m3 also increases due the increased current. This decreases the Vgs of m1 resulting in a negative feedback loop.

When transistors m7 and m8 are switched on (in response to a high level of signal "charge sw"), capacitor C is charged by transistor m9. Transistor m9 is implemented outside a sensor array (the array comprising the sensor cell containing elements 1, 2, m1, and m2, and other sensor cells not shown in FIG. 2) at the bottom of column line 3 (transistor m9 is not implemented physically adjacent to photodiode 2 or between photodiode 2 and a neighboring photodiode sensor). In contrast, transistor m1 is implemented in the sensor array (transistor m1 is implemented to be physically adjacent to photodiode 2, e.g., laterally between photodiode 2 and a neighboring photodiode). Thus transistor m9 is not limited to have a small size, as is transistor m1 in typical implementations of FIG. 2. In the FIG. 2 circuit, transistor m9 can be (and preferably is) implemented to be much larger than transistor m1. Also, transistor m9 can have its own power bus (which maintains the drain of transistor m9 at the voltage Vdd above ground) outside the sensor array, distinct from the power bus within the sensor array that maintains the drain of transistor m1 at the voltage "bias" above ground. Thus, the FIG. 2 circuit can easily be implemented so that the current I3 provided by transistor m9 (via transistor m8) to charge the capacitor C is increased by a factor of ten above the current I1 flowing through transistors m1 and m2 to transistor m3 of the Wilson current mirror.

Figure 3:
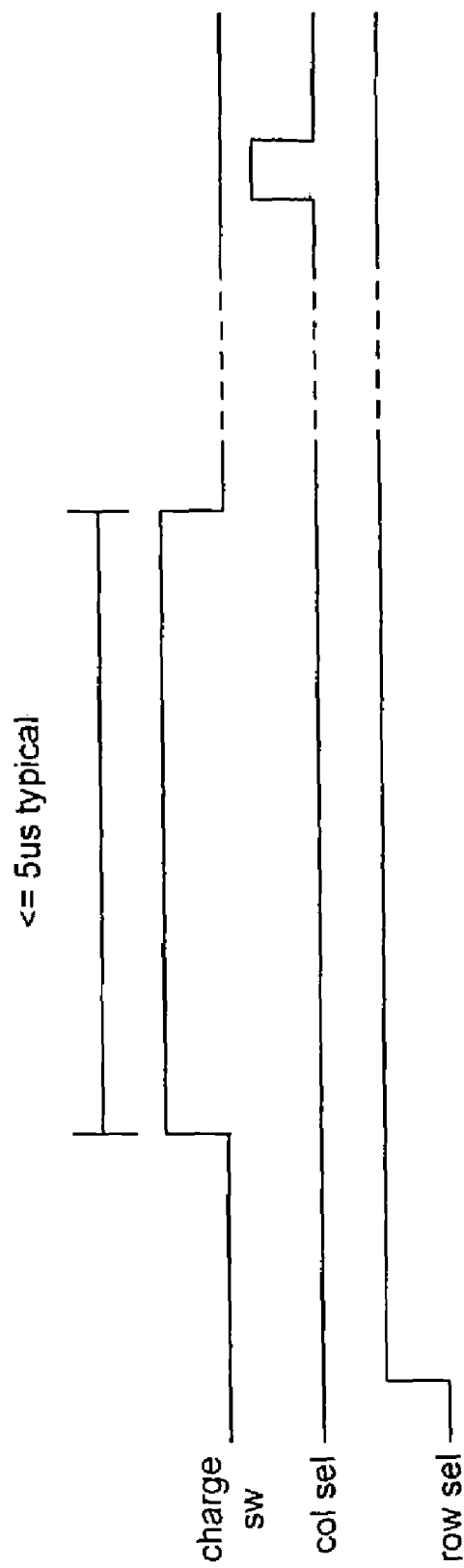
FIG. 3 is a timing diagram of signals asserted during readout of photodiode 2 of FIG. 2.

FIG. 3 is a timing diagram of signals asserted during readout of photodiode 2 by the readout circuitry of FIG. 2. Photodiode 2's row is selected by asserting the signal "row sel" with a high level to turn on transistor m2. Then the signal "charge sw" is taken high to turn on transistors m7 and m8, thus causing current I3 to charge up capacitor C to a state indicative of the voltage at Node A (at the gate of transistor m1 as shown in FIG. 2). The characteristics of transistors m3, m4, m5, and m9 are chosen so that the potential at Node E (the source of transistor m9) rapidly settles to a value at least substantially identical (and preferably identical) to the potential at Node A (at the gate of transistor m1) as capacitor C charges. Thus, capacitor C charges until the potential at node D rapidly settles to a value at which capacitor C stores charge indicative of the radiation incident on photodiode 2 during the exposure period. After the brief charging time, the signal "charge sw" is taken low (e.g., 5 microseconds after going high, which is 1/10 the time typically required to charge capacitor C in the FIG. 1 circuit) thereby turning off transistors m7 and m8, to isolate capacitor C from transistor m9. Typically, these steps occur in parallel for all columns in one row. When the potential at Node A (and the potential at the corresponding node of each other cell of the row) has thus been sampled onto capacitor C (and its counterparts in the other cells of the row), the column select signal "col sel" is pulsed high to turn on transistor m6 briefly, thereby asserting the potential at Node D (indicative of the voltage across capacitor C) to video bus 5. Typically, the column select signals ("col sel" and its counterparts for the other columns) are sequentially pulsed on to read out (sequentially) sensor signals for all the sensors along the row. The described steps are then repeated for each other row of the sensor array.

Simulations of the FIG. 2 circuit have been performed, with the assumptions that capacitor C has a capacitance of 5 pF and that the transistors have typical characteristics for biasing and readout of an array of CMOS active pixel sensors. The simulations have shown that the response time of the readout circuitry of FIG. 2 (the time required for capacitor C to charge up to a state indicative of the voltage at Node A, in response to a low-to-high transition of control signal "charge sw") is well below 1 $\mu$sec (typically 200 nsec or less).

Matching of transistors m1 and m9 of FIG. 2 was simulated by performing a sequence of simulations, each time with the transconductance (gm) of one of the devices increased by 5% above the gm value assumed in the previous simulation. The simulations predicted output variation of only 1.5% in response to the variation of the transconductance of device m1 relative to the transconductance of device m9. This small output variation is believed to be due to the negative feedback topology of the FIG. 2 circuit.

Another advantage of employing preferred embodiments of the invention to read sensor cells connected along column lines of a typical imager (image detector) arises when, as is typical, each column line has a high parasitic capacitance. If voltage sensing is employed to read out the sensor cells (e.g., using the conventional readout circuit of FIG. 1), operation of the readout circuit will be adversely affected by the parasitic capacitance and the adverse effect will be more severe when the parasitic capacitance is greater. In contrast, if current sensing is employed in accordance with the invention to read out the sensor cells (e.g., using the readout circuit of FIG. 2 or 4), the parasitic capacitance will have no significant adverse effect on operation of the readout circuit, and operation of the readout circuit will be independent (at least to first order) of the parasitic capacitance.

An alternative embodiment of the invention will next be described with reference to FIG. 4. The elements of FIG. 4 that are identical to corresponding elements of FIG. 2 are numbered identically in FIGS. 4 and 2 and the description thereof will not be repeated.

FIG. 4 is a diagram of an image detector that includes sensor cell array 10 and readout circuitry 11. In a typical implementation, array 10 includes 2R rows and 2S columns of sensors, where each of R and S is a large number of sensor cells. Array 10 includes column line 3, and (2S−1) other column lines (identified by the reference numeral 12). Two sensor cells (one including photodiode 2; the other including photodiode 22) are shown connected along column line 3 within array 10, but (2R−2) other sensor cells (not shown) are typically also connected along column line 3 within array 10. A simplified schematic diagram of an embodiment of the inventive readout circuit (for reading out each sensor cell connected along column line 3) is shown within block 11. Another readout circuit (not shown) identical to the readout circuit shown would typically be connected at the bottom of each of column lines 12 and coupled to video bus 5.

The readout circuit of FIG. 4 coupled between column line 3 and video bus 5 comprises NMOS transistors m3, m4, m5, m6, m8, m9, and m10 and capacitors C and C2, connected as shown at the bottom of column line 3. The readout circuit of FIG. 4 circuit differs from that of FIG. 2 in the following respects. In the readout circuit shown in FIG. 4, the drain of transistor m5 is connected directly to the source of transistor m9 (transistor m7 of FIG. 2 is replaced by a short circuit). Also, transistor m9 is biased in a different manner than in FIG. 2. In FIG. 4, the drain of transistor m9 is maintained at the same potential ("bias") as is the drain of transistor m1, and the gate of transistor m9 is biased by transistor m10 and capacitor C2. When transistor m10 is turned on (by asserting row select signal "row sel" with a high value to the gate of transistor m10), the gate of transistor m9 is held at the same potential (VREF) that is applied to the gate of transistor m1 when photodiode 2 is reset (i.e., before photodiode 2 is exposed to the radiation to be sensed). This ensures that transistors m1 and m9 operate in the same regime during readout of the sensor cell.

FIG. 4 also shows elements m21, m22, m23, and 22 of a second sensor cell connected along column line 3. The second sensor cell is identical to the sensor cell comprising elements m1, m2, 1, and 2, with NMOS transistor m21 corresponding to transistor m1, NMOS transistor m22 corresponding to transistor m2 (but operating in response to row select signal "row sel 2" rather than "row sel"), NMOS transistor m23 corresponding to switch 1(but operating in response to reset signal "reset 2" rather than "reset"), and photodiode 22 corresponding to photodiode 2. In typical operation, only one of row select transistors m22 and m2 is switched on at the same time, and photodiodes 2 and 22 are read out sequentially. However, in a "binning" mode of operation (to be described below) both of transistors m22 and m2 are switched on simultaneously, and capacitor C is charged in response to the combined current flowing to Node C from transistors m1 and m21 to allow generation of a combined output signal indicative of the sum of the radiation intensities at photodiodes 2 and 22.

In typical operation of the readout circuit shown in FIG. 4 to read out photodiode 2 after an exposure period, photodiode 2's row is selected by asserting the signal "row sel" with a high level to turn on transistor m2 and m10. Then the signal "charge sw" is taken high to turn on transistor m8, thus causing current to flow from transistor m9 to charge up capacitor C to a state indicative of the voltage at Node A (at the gate of transistor m1). The characteristics of transistors m3, m4, m5, and m9 are chosen so that the potential at Node E (the source of transistor m9) rapidly settles to a value at least substantially identical (and preferably identical) to the potential at Node A as capacitor C charges. Thus, capacitor C charges until the potential at node D settles to a value at which capacitor C stores charge indicative of the radiation incident on photodiode 2 during the exposure period. After the brief charging time, the signal "charge sw" is taken low (e.g., 5 microseconds after going high, which is ⅟₁₀ the time typically required to charge capacitor C in the FIG. 1 circuit), to turn off transistor m8 and thus isolate capacitor C from transistor m9. Typically, these steps occur in parallel for all columns (with the same row selected in each column). When the potential at Node A (and the potential at the corresponding node of each other cell of the row) has thus been sampled onto capacitor C (and its counterparts in the other cells of the row), the column select signal "col sel" is pulsed high to turn on transistor m6 briefly, thereby asserting the potential at Node D (indicative of the voltage across capacitor C) to video bus 5. Typically, the column select signals ("col sel" and its counterparts for the other columns) are sequentially pulsed on to read out (sequentially) sensor signals for all the sensors along the row. The described steps are then repeated for each other row of the sensor array.

Another advantage of the invention is that it allows for improved binning of the outputs of individual sensors of an image sensor array. "Binning" is the combining of multiple pixels (e.g., 2×2 or 4×4 subsets of pixels) of a sensed image, for example to produce lower resolution pictures with higher light sensitivity. A typical application of binning is to make a reduced-resolution video image or viewfinder image from an imager that can produce a high resolution still image. Binning can also be performed to obtain a super-high-speed low-resolution mode from an imager that normally produces a standard or high-speed video output.

Typically, a binning operation adds or averages the signals from the sensors in multiple rows and columns of a sensor array. For example, assuming an array of 2R rows of sensors, the signals from the "N"th and (N+1)th sensors in the Mth row of the array (where M is an odd number) and the signals from the "N"th and (N+1)th sensors in the (M+1)th row of the array are added or averaged together, for each value of M in the range $1 \leq M \leq (2R)-1$.

In an imager comprising an array of sensors of the type shown in FIG. 1, 2, or 4, and readout circuitry (of the type shown in FIG. 1, 2, or 4) connected at the bottom of each column line, signals from sensors in adjacent columns can be easily and accurately combined to accomplish binning. This can be done by simultaneously connecting the relevant column lines to the video bus at the appropriate time. For example, transistor m16 of FIG. 1 and the corresponding transistor of each other one of the relevant column lines are simultaneously switched on after the storage capacitor for each column (e.g., capacitor C of FIG. 1 and the corresponding capacitor of each other one of the relevant column lines) has been charged and then decoupled from the transistor that charged it (e.g., from transistor m1 of FIG. 1 and the corresponding transistor of each other one of the relevant column lines). For another example, transistor m6 of FIG. 2 (or FIG. 4) and the corresponding transistor of each other one of the relevant column lines are simultaneously switched on after the storage capacitor for each column (e.g., capacitor C of FIG. 2 and the corresponding capacitor of each other one of the relevant column lines) has been charged and then decoupled from the transistor that charged it (e.g., from transistor m9 of FIG. 2 and the corresponding transistor of each other one of the relevant column lines). The signals from multiple columns combine linearly by charge sharing when multiple column capacitors are selected onto a common readout line (e.g., the video bus).

However, in an imager comprising an array of sensors of the type shown in FIG. 1 and conventional readout circuitry (of the type shown in FIG. 1) connected at the bottom of each column line, the outputs of multiple sensors connected along the same column (each sensor connected along a different row) cannot be accurately combined simply by charging the column's storage capacitor (capacitor C of FIG. 1) in response to the source follower transistors (e.g., transistor m1 of FIG. 1) of two or more rows at the same time, and then decoupling the capacitor from the source follower transistor of each row, and finally connecting the capacitor to the video bus (by switching on transistor m16 of FIG. 1) to assert a combined output signal from the capacitor to the video bus.

The explanation for this is as follows. In a typical CMOS active pixel sensor (e.g., the sensor cell including elements 1, 2 and m1 of FIG. 1), a voltage on a photodiode is precharged to a positive reset voltage ("VREF" in FIG. 1), and the voltage on the photodiode decreases as light or leakage discharges the photodiode. After an exposure, the voltage is read out via a source follower transistor (transistor m1 of FIG. 1) by charging a capacitor coupled to the relevant column line when the row is selected. If several rows are selected at once, the paralleled source follower transistors will drive the column line higher, to a voltage that will tend to follow the higher voltage signals (at the gate of each source follower transistor) and ignore the lower voltage signals (at the gate of each source follower transistor). If the voltage signals at the gates of the source follower transistors are close to each other, the result is an average, but if they are far apart the result favors the maximum voltage. Since the higher input voltages correspond to darker pixels, this nonlinear combination can be viewed as a "softmin" on light intensity, which will (for example) tend to ignore or discount a "hot" (leaky) pixel in a block of darker pixels. If the sensors of a block of selected rows sense an image of a light-to-dark edge, the dark side will tend to dominate the aggregate if all the rows are selected at the same time. Therefore, the apparent position of the edge may undesirably shift by a fraction of the block size (a fraction of a pixel at the output resolution) in a direction tending to expand the darker area.

In accordance with the invention, an imager comprising an array of sensors of the type shown in FIG. 2 or FIG. 4 and readout circuitry of the type shown in FIG. 2, 4, 5, 6, or 7 connected at the bottom of each column line, the outputs of multiple sensors connected along the same column (each sensor connected along a different row) can be simply and more accurately combined as follows. We explain how this is done with reference to FIG. 4, although the explanation applies equally well to the FIG. 2 embodiment which will typically include additional sensors cells (not shown in FIG. 2) connected along column line 3. Capacitor C of FIG. 4 is charged in response to readout circuit transistor m9 while the source follower transistors (e.g., m1 and m21) of each of two or more rows are coupled (e.g., via row selection transistors m2 and m22) to Node C of the Wilson current mirror of the readout circuit. The capacitor is then decoupled from transistor m9 (by switching off transistor m8 of FIG. 4, or transistors m7 and m8 of FIG. 2), and finally the capacitor is connected to the video bus (by switching on transistor m6) to assert an output signal from the capacitor to the video bus. The output signal resulting from these steps is more accurately indicative of the sum of the radiation intensities at the sensors of all the rows, because the currents through the channels of the source follower transistors (e.g., m1 and m21) will simply sum at Node C, and thus the potential at Node D (at one plate of capacitor C) will settle to a value indicative of the sum of these currents.

Binning operation of the circuits of FIGS. 2 and 4 has been simulated, with the assumptions that capacitor C has a capacitance of 5 pF, that the transistors have typical characteristics for biasing and readout of an array of CMOS active pixel sensors, and that each circuit is operated to charge capacitor C while two rows are simultaneously selected to couple two source follower transistors (m1 and m21) simultaneously to column line 3 each via a different row select transistor (m2 and m22), then to decouple capacitor C from transistor m9, and finally to pulse transistor m6 on briefly to assert a combined output signal from capacitor C to video bus 5. The potential at the gate of one of the transistors (e.g., transistor m1 of FIG. 4) is assumed to be V1, and the potential at the gate of the other one of transistors (e.g., transistor m21 of FIG. 4) is assumed to be V2. The simulations showed that when V1= 1.8 volts and V2=2.2 volts, and the circuit is operated at room temperature, the combined output signal asserted from capacitor C to video bus 5 would be 1.457 volts (which is very close to the ideal predicted value of 1.44 volts). The simulations also showed that when V1=1.8 volts and V2=2.8 volts, and the circuit is operated at room temperature, the combined output signal asserted from capacitor C to video bus 5 would be 0.929 volts (whereas the ideal predicted value is 1.18 volts).

The simulations showed that when V1=1.8 volts and V2=2.2 volts, and the circuit is operated at −20° C., the combined output signal asserted from capacitor C to video bus 5 would be 1.452 volts (which is very close to the ideal predicted value of 1.44 volts). The simulations also showed that when V1=1.8 volts and V2=2.8 volts, and the circuit is operated at −20° C., the combined output signal asserted from capacitor C to video bus 5 would be 0.927 volts (whereas the ideal predicted value is 1.18 volts).

The simulations showed that when V1=1.8 volts and V2=2.2 volts, and the circuit is operated at 60° C., the combined output signal asserted from capacitor C to video bus 5 would be 1.459 volts (which is very close to the ideal predicted value of 1.44 volts). The simulations also showed that when V1=1.8 volts and V2=2.8 volts, and the circuit is operated at 60° C., the combined output signal asserted from capacitor C to video bus 5 would be 0.931 volts (whereas the ideal predicted value is 1.18 volts).

As can be seen, if the difference between the two input signals to be binned is small (less than 400 mV apart), the error due to binning is small but as the two input signals to be binned are separated by larger amounts (e.g., 1 volt), the error between the ideal binned value and the actual binned value becomes greater (but is still expected to be undetectable by the human eye for all practical purposes). Because of the nature of the described embodiments of the inventive circuit, temperature variations do not produce significant changes.

The readout circuitry of each of FIGS. 2 and 4 has an input line (e.g., column line 3 of FIGS. 2 and 4) and includes a Wilson current mirror and other circuitry for mirroring an input current flowing through the input line (e.g., input current I1 of FIGS. 2 and 4), thereby producing a mirrored current (e.g., current I2 of FIG. 2) at a capacitor-charging node (e.g., Node E of FIG. 2). Optionally, the readout circuitry applies a non-unity current multiplication factor to the input current. It should be appreciated that other embodiments of the inventive readout circuitry employ other circuitry (not necessarily including a Wilson current mirror) for mirroring an input current (indicative of a sensor signal) that flows through an input line, thereby producing a mirrored current at a capacitor-charging node (including by optionally applying a non-unity current multiplication factor to the input current).

The readout circuitry of each of FIGS. 2 and 4 essentially converts the mirrored current at the capacitor-charging node to a voltage (e.g., the voltage at Node E of FIG. 2), and provides capacitor-charging current (e.g., current I3 of FIG. 2) determined by this voltage from the capacitor-charging node to a capacitor (capacitor C of FIG. 2). It should be appreciated that other embodiments of the inventive readout circuitry employ other circuitry to provide capacitor-charging current from a capacitor-charging node to a storage capacitor. Such other circuitry does not necessarily convert a mirrored current at the capacitor-charging node to a voltage, and the capacitor-charging current provided by such other circuitry to the storage capacitor is not necessarily determined by a voltage into which the mirror current has been converted.

Another aspect of the invention is a method for reading out a sensor cell. In a class of embodiments, the method comprises the steps of: (a) asserting a sensor current (indicative of a sensed value) from the sensor cell to an input node of a readout circuit, and (b) operating the readout circuit in response to the sensor current to generate an output voltage indicative of the sensed value while clamping the input node at a potential that is at least substantially fixed. In some such embodiments, step (b) also includes the step of charging a capacitor to a voltage indicative of the sensed value. In some embodiments, step (b) includes the steps of: generating a mirrored current in response to the sensor current; converting the mirrored current to a charging voltage; and charging a capacitor to the output voltage in response to the charging voltage. In some such embodiments, the mirrored current is not identical to the sensor current. For example, in some embodiments, the mirrored current is I2= ($\alpha$)(I1), where $\alpha$ is a non-unity current multiplication factor (i.e., $\alpha \neq 1$) and I1 is the sensor current. In some preferred embodiments, $\alpha > 1$. In other embodiments, step (b) includes the step of operating a differential pair to assert the output voltage to a node coupled to a capacitor while providing feedback via at least one circuit element (e.g., a load transistor) to the input node. In other embodiments, step (b) includes the step of operating an op amp to assert the output voltage to an output node coupled to a capacitor while providing feedback from the output node to the input node.

In another class of embodiments, the inventive method comprises the steps of: asserting a sensor current, indicative of a sensed value, from the sensor cell to an input node of a readout circuit; operating the readout circuit to generate a mirrored current in response to the sensor current while clamping the input node at a potential that is at least substantially fixed; and operating the readout circuit to generate an output indicative of the sensed value in response to the mirrored current. In some such embodiments, the mirrored current is not identical to the sensor current. For example, in some embodiments, the mirrored current is I2=($\alpha$)(I1), where $\alpha$ is a non-unity current multiplication factor (i.e., $\alpha \neq 1$) and I1 is the sensor current. In some preferred embodiments, $\alpha > 1$.

The expression "current mode operation" of a column is used herein to denote an operating mode in which current flowing from a cell (or from each cell of a sequence of cells) connected along a column line is sensed to read the cell (or cells). As explained above, a key operational consideration for current mode operation of a column is to reduce (e.g., minimize) variation of the voltage on the column line with varying levels of current flow on the column line. The column voltage should be pinned (clamped) to ensure at least to a first order that the column stray capacitance is not excited and does not contribute to bandwidth or charging current considerations. This requirement of voltage clamping implies feedback.

The Wilson current mirror of the readout circuit of FIG. 2 (and FIG. 4) provides feedback to allow the readout circuit to clamp the column line voltage during current mode operation in which the Wilson current mirror is coupled to a column line. During current mode operation of such readout circuit, a sensor current (indicative of a sensed value) is asserted from a sensor cell to the input node of the Wilson current mirror, and the readout circuit operates in response to this current to charge a capacitor to a voltage indicative of the sensed value while clamping the input node at a potential that is at least substantially fixed.

We next describe a class of embodiments in which the inventive apparatus includes a sensor cell and a current sensing readout circuit coupled to the sensor cell, and the readout circuit does not include a Wilson current mirror. In these embodiments, the readout circuit includes a current sensing input node, an output node, and output voltage generation circuitry between the current sensing input node and the output node. In typical embodiments in this class, a readout capacitor is coupled to the output node and the readout circuit's input node is coupled by a column line to the sensor cell. In current mode operation of such typical embodiments, a sensor current (indicative of a sensed value) is asserted from the sensor cell to the input node and the readout circuit operates in response to the sensor current to charge the readout capacitor to a voltage indicative of the sensed value while clamping the input node at a potential that is at least substantially fixed.

One embodiment in this class will be described with reference to FIG. 5. Readout circuit 20 of this embodiment employs an op amp (op amp 21) for sensor current to voltage conversion. In FIG. 5, resistor R is connected between the inverting input of op amp 21 and the output of op amp 21. Op amp 21's inverting input is coupled to column line 3. The output of op amp 21 is labeled as Node D in FIG. 5. A sensor cell including photodiode 2, switch 1, and NMOS transistors m1 and m2 (connected as shown in FIG. 5) is connected along column line 3. Typically also, additional sensor cells (identical to the one shown in FIG. 5) forming a sensor cell array are connected along column line 3 and along other column lines (not shown). Transistor m2 is a row select transistor that can be turned on (by asserting a "row select" signal to its gate) to select a row (including the sensor cell shown) of the sensor cell array. When the row select signal is high, sensor current Iin (indicative of a sensed value) flows through the channels of NMOS transistors m1 and m2 and along column line 3 to the inverting input of op amp 21. In response to sensor current Iin, op amp 21 asserts output voltage Vout at Node D.

The drain of column select transistor m6 (an NMOS transistor) and readout capacitor C are coupled to Node D. The source of transistor m6 is coupled to a video bus.

The noninverting input of op amp 21 is held at reference potential Vref. Op amp 21 closes a feedback loop by asserting Vout at Node D such that the potential at op amp 21's inverting input is the same (or very nearly the same) as Vref, so that feedback current Ifb (flowing from op amp 21's inverting input through resistor R) is at least substantially equal to the sensor current Iin, and Ifb is at least substantially equal to (Vout−Vref)/R. The output of the readout circuit (the voltage at Node D) is asserted to the video bus by pulsing on column select transistor m6 at appropriate times (by asserting the signal "col sel" with a high level at transistor m6's gate).

Readout circuit 20 of FIG. 5 thus operates in response to sensor current Iin to charge readout capacitor C to a voltage indicative of the sensed value while clamping its input node (the inverting input of op amp 21) at a potential that is at least substantially fixed. The FIG. 5 circuit is typically implemented as part of an integrated circuit that includes a readout circuit (identical to circuit 20) coupled to each of a plurality of column lines. In typical silicon processes, resistors (e.g., resistor R of FIG. 5) are notoriously poorly matched and consume area. Thus, we contemplate that in many applications it will be preferable to employ an embodiment of the invention that includes readout circuit 40 of FIG. 6 (which does not include a resistor between the output and the inverting input of an op amp) rather than readout circuit 20 of FIG. 5.

Readout circuit 40 of FIG. 6 also employs an op amp (op amp 41) for sensor current to voltage conversion. In circuit 40, NMOS transistor 42 (rather than a resistor) is connected between the inverting input and the output of op amp 41, with the drain of transistor 42 connected to the column line (not shown in FIG. 6) and the inverting input of op amp 41. The source and substrate of transistor 42 are held at potential Vneg. The gate of transistor 42 is connected to the output of op amp 41. The source and drain of transistor 42 will sometimes be referred to herein as channel terminals. In response to sensor current Iin (indicative of a sensed value) flowing from column line 3 to the inverting input of op amp 41, op amp 41 asserts output voltage Vout at Node D.

The drain of column select transistor m6 (an NMOS transistor) and readout capacitor C are coupled to Node D. The source of transistor m6 is coupled to a video bus (not shown in FIG. 6).

The noninverting input of op amp 41 is held at reference potential Vref. Op amp 41 closes a feedback loop by asserting Vout at Node D such that the potential at op amp 21's inverting input is the same (or very nearly the same) as Vref, so that feedback current (flowing to Node D through the channel of transistor 42) is at least substantially equal to the sensor current Iin. The output voltage Vout modulates the resistance of transistor 42, providing variable resistance that depends upon current Iin. The output of the readout circuit (the voltage at Node D) is asserted to a video bus by pulsing on column select transistor m6 at appropriate times (by asserting a high level of the signal "col sel" at transistor m6's gate).

Circuit 40 of FIG. 6 will only pull down, and thus it provides uni-polar operation. The pulling up, to provide true bipolar operation, is provided by an output transistor (e.g., transistor m1 of FIG. 5) of a sensor cell that sources the sensor current Iin. Thus, such an output transistor of a sensor cell is necessary to operation of readout circuit 40 of FIG. 6.

When coupled to a sensor cell via column line 3, readout circuit 40 of FIG. 6 operates in response to sensor current Iin to charge readout capacitor C to a voltage indicative of a sensed value while clamping its input node (the inverting input of op amp 41) at a potential that is at least substantially fixed.

Because op amps can be very complex and consume lots of power, we contemplate that it will be preferable, in many applications, to employ an embodiment of the invention that includes readout circuit 60 of FIG. 7 (which does not include an op amp) in place of readout circuit 20 of FIG. 5 or readout circuit 40 of FIG. 6.

Readout circuit 60 of FIG. 7 employs a simple differential pair (comprising NMOS transistors 63, 64, 65, 66, and 67) and a load transistor (NMOS transistor 62), connected as shown.

Sensor current Iin (indicative of a sensed value) flows from column line 3 to the drain of load transistor 62, which is the input node of circuit 60 (labeled "inverting node" in FIG. 7). The gate of load transistor 62 is connected to the output node of circuit 60 (node D), at which circuit 60 asserts output voltage Vout (also indicative of the sensed value) in response to sensor current Iin. The source and substrate of transistor 62 are held at potential Vneg.

The drain of column select transistor m6 (an NMOS transistor) and readout capacitor C are coupled to Node D. The source of transistor m6 is coupled to a video bus (not shown in FIG. 7).

The gate of transistor 65 is also coupled to the input node of circuit 60. The gate of transistor 66 is held at reference potential Vref. Transistor 62 closes a feedback loop in a manner to be explained below. The output of readout circuit 60 (the voltage at Node D) is asserted to the video bus by pulsing on column select transistor m6 at appropriate times (by asserting a high level of the signal "col sel" at transistor m6's gate).

The drains of transistors 63 and 64 are held at potential Vpos, and their gates are coupled to Node D. The drain of transistor 65 is coupled to the source of transistor 63, the drain of transistor 66 is coupled to the source of transistor 64, and the sources of transistors 65 and 66 are coupled to the drain of transistor 67. The gate and drain of transistor 67 are held at potential Vneg. Current I1 flows through the channels of transistors 63 and 65, current I2 flows through the channel of transistor 66, and tail current I3=I1+I2 flows through the channel of transistor 67.

The differential pair operates to provide feedback around load transistor 62 to reduce (e.g., minimize) the voltage excursion on the inverting node during current mode operation. When the potential at the inverting node rises, transistor 65 pulls more current (I1) down the left hand limb of the biasing structure, and since the tail current I3 of the differential pair is constant, current I2 in the right hand limb is decreased. Also, output voltage Vout (at node D) rises which turns load transistor 62 on harder, which in turn brings the potential at the inverting node back down. Conversely, when the potential at the inverting node falls, output voltage Vout (at node D) falls which causes load transistor 62 to provide feedback which in turn causes the potential at the inverting node to rise.

When coupled to a sensor cell via column line 3, readout circuit 60 of FIG. 7 thus operates in response to sensor current Iin to charge readout capacitor C to a voltage indicative of a sensed value while clamping its input node (the gate of transistor 65) at a potential that is at least substantially fixed.

Operationally, a readout circuit employing a differential pair (e.g., readout circuit 70 of FIG. 7) is superior in several respects to a readout circuit which employs a Wilson current mirror as described herein (e.g., the readout circuit of FIG. 2 or 4). However, typical implementations of the latter type of readout circuit (a "Wilson current mirror" readout circuit) are superior in speed to typical implementations of a readout circuit employing a differential pair (a "differential pair" readout circuit), although typical implementations of both "Wilson current mirror" and "differential pair" readout circuits are very much faster than conventional readout circuits of the type described with reference to FIG. 1. The output voltage of a typical Wilson current mirror readout circuit settles (to a value indicative of the sensed value) in about 30 ns. The output voltage of a typical differential pair readout circuit settles in about 100 ns. The output voltage of a typical implementation of the conventional FIG. 1 readout circuit requires about 50 $\mu$s to settle. Both Wilson current mirror readout circuits and differential pair readout circuits have sufficient speed for typical applications.

Both Wilson current mirror readout circuits and differential pair readout circuits also have improved bandwidth (relative to conventional readout circuits such as that of FIG. 1) due to their greater speed.

Advantages of typical implementations of a differential pair readout circuit, relative to typical implementations of a Wilson current mirror readout circuit, include the following:
  clamping of the input node is accomplished in an improved manner (so that the column line voltage moves far less during current mode operation);
  integrated circuit implementations can be manufactured with better matching;
  summation of column currents for "binning" is better (the output signal generated by a typical differential pair readout circuit in response to simultaneously asserted sensor currents from multiple sensor cells connected along a column line is more accurately indicative of the sum of the sensor values of all the sensor cells than is the output signal generated by a typical Wilson Current mirror readout circuit in response to same simultaneously asserted sensor currents from the same sensor cells); and compliance is increased (there is greater dynamic range and less susceptibility to column resistances).

Typical implementations of differential pair readout circuits and Wilson current mirror readout circuits that embody the invention have reduced peak current (resulting in lower noise and a less constrained design) relative to conventional sensor readout circuits.

While best modes for implementing the present invention and applications of the invention have been described herein, it will be apparent to those of ordinary skill in the art that many variations on the embodiments and applications described herein are possible without departing from the scope of the invention described and claimed herein. It should be understood that while certain forms of the invention have been shown and described, the invention is not to be limited to the specific embodiments described and shown or the specific methods described. Further, the claims that describe methods do not imply any specific order of steps unless explicitly described in the claim language.

What is claimed is:

1. A sensing apparatus, including:
   at least one sensor cell configured to produce a sensor current indicative of a sensed value; and
   a readout circuit having an input node coupled to receive the sensor current, wherein the readout circuit also includes:
   an output node; and
   output voltage generation circuitry between the input node and the output node, wherein the output voltage generation circuitry is configured to generate an output voltage indicative of the sensed value in response to the sensor current while clamping the input node at a potential that is at least substantially fixed.

2. The sensing apparatus of claim 1, wherein the output voltage generation circuitry includes:
   at least one circuit element; and
   a differential pair coupled and configured to provide feedback to the at least one circuit element to reduce voltage excursion at the input node during generation of the output voltage.

3. The sensing apparatus of claim 2, wherein the at least one circuit element is a load transistor coupled to the differential pair.

4. The sensing apparatus of claim 1, wherein the output voltage generation circuitry includes:
   an op amp having an input coupled to the input node and an output; and
   at least one circuit element coupled between the output of the op amp and the input node and configured to provide feedback from output of the op amp to the input node.

5. The sensing apparatus of claim 4, wherein the input of the op amp is an inverting input, the op amp also has a noninverting input, and the at least one circuit element is a resistor coupled between the inverting input and the output of the op amp.

6. The sensing apparatus of claim 4, wherein the input of the op amp is an inverting input, the op amp also has a noninverting input, and the at least one circuit element is a transistor having a channel terminal coupled to the inverting input and a gate coupled to the output of the op amp.

7. The sensing apparatus of claim 1, also including:
   a sensor cell; and
   a column line, wherein the input node is coupled by the column line to the sensor cell, and wherein the output voltage generation circuitry also includes:
   a readout capacitor coupled to the output node, and the output voltage generation circuitry is configured to charge the readout capacitor to a voltage indicative of the sensed value while clamping the input node at a potential that is at least substantially fixed.

8. A method for reading out a sensor cell, comprising the steps of:
   (a) asserting a sensor current, indicative of a sensed value, from the sensor cell to an input node of a readout circuit; and
   (b) operating the readout circuit in response to the sensor current to generate an output voltage indicative of the sensed value while clamping the input node at a potential that is at least substantially fixed.

9. The method of claim 8, wherein step (b) also includes the step of charging a capacitor to a voltage indicative of the sensed value.

10. The method of claim 8, wherein step (b) includes the step of:
    operating a differential pair to assert the output voltage to an output node coupled to a capacitor while providing feedback from the output node via at least one circuit element to the input node.

11. The method of claim 10, wherein step (b) includes the step of:
    operating the differential pair to assert the output voltage to the output node while providing feedback from the output node via a load transistor to the input node.

12. The method of claim 8, wherein step (b) includes the step of:
    operating an op amp to assert the output voltage to an output node of the op amp while providing feedback from the output node of the op amp to the input node, wherein the output node of the op amp is coupled to a capacitor.

13. The method of claim 8, wherein step (b) includes the steps of:
    generating a mirrored current in response to the sensor current;
    converting the mirrored current to a charging voltage; and
    charging a capacitor to the output voltage in response to the charging voltage.

14. The method of claim 8, wherein the mirrored current is not identical to the sensor current.

15. The method of claim 14, wherein the mirrored current is greater than the sensor current.

* * * * *